(12) United States Patent
Zhang

(10) Patent No.: US 7,298,651 B2
(45) Date of Patent: Nov. 20, 2007

(54) ARCHITECTURE FOR VIRTUAL GROUND MEMORY ARRAYS

(75) Inventor: Ruili Zhang, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 147 days.

(21) Appl. No.: 11/157,189

(22) Filed: Jun. 17, 2005

(65) Prior Publication Data

US 2006/0285421 A1 Dec. 21, 2006

(51) Int. Cl.
 *G11C 11/34* (2006.01)
(52) U.S. Cl. .............................. 365/185.16; 365/185.11
(58) Field of Classification Search ........... 365/185.16, 365/185.11, 185.13
 See application file for complete search history.

(56) References Cited

U.S. PATENT DOCUMENTS

| 5,460,990 | A | 10/1995 | Bergemont |
| 5,930,195 | A | 7/1999 | Komatsu |
| 5,982,669 | A | 11/1999 | Kalnitsky et al. |
| 6,175,519 | B1 * | 1/2001 | Lu et al. ................ 365/185.02 |
| 6,233,168 | B1 | 5/2001 | Kokubun et al. |
| 7,193,901 | B2 * | 3/2007 | Ruby et al. ............ 365/185.33 |
| 2002/0196698 | A1 | 12/2002 | Eitan |
| 2006/0285386 | A1 * | 12/2006 | Maayan ................ 365/185.13 |

* cited by examiner

*Primary Examiner*—Anh Phung
(74) *Attorney, Agent, or Firm*—Trop, Pruner & Hu, P.C.

(57) ABSTRACT

The drain programming window in virtual ground memory arrays may be enlarged by reducing the number of voltage drops in the cell access path. This reduction may be accomplished by reducing the number of transistors in the access path or by otherwise reducing the resistance in the access path.

19 Claims, 5 Drawing Sheets

ARCHITECTURE FOR VIRTUAL GROUND MEMORY ARRAYS

BACKGROUND

This invention relates generally to sensing virtual ground flash memory arrays.

Flash memories with progressively reduced costs have been developed by increasing memory density and reducing die size. One way to reduce die size is to use a virtual ground technique. In a virtual ground technique, the contact is removed from the drain of the flash cell.

In one architecture for virtual ground memories, an upper portion of the architecture includes global decode and global select transistors and a lower portion contains flash cell blocks and local decode devices, local Y select transistors, and shunt devices. The shunt devices may have their gates connected to selection circuits. The local Y select transistors have their gates connected to a local bitline. The local Y select transistors are connected between global bitlines and local bitlines. The shunt devices are connected between two local bitlines. Current flow through a primary path includes the global select transistor, global bitline resistor, local Y select transistor, a shunt device, a local bitline RC, and a selected flash cell, as well as a local bitline RC, another local Y select transistor, the global bitline resistance, and the global Y select transistor. Current flow through each device in the path may cause voltage drops.

DETAILED DESCRIPTION

Selected flash cells may be programmed by a fixed select voltage (VDtrim). The fixed select voltage may be applied at the top of a local bitline when the maximum programming current flows through the farthest cell at the farthest block. The bitline voltage may not exceed the disturb voltage which would cause a disturb of an unselected cell. The actual maximum voltage on a selected local bitline is VDmax.

The difference between VDmax and VDtrim is the drain programming window. The maximum voltage that an unselected cell sees on its drain or source in a virtual ground memory is higher than the voltage seen in conventional flash arrays. Moreover, virtual ground arrays also have a higher worst case local bitline resistance for cells far away from the local select transistor. Therefore, some drain programming window of a virtual ground memory may be lost relative to existing technologies. The window loss may be due, for instance, to local bitline resistance or voltage drops due to shunt devices. Thus, a significant negative margin may potentially be developed in virtual ground memory arrays versus conventional technologies.

In accordance with some embodiments of the present invention, virtual ground array architectures may have an improved drain programming window. In some embodiments, the drain programming window may be enlarged by reducing local bitline resistance, voltage drops due to shunt devices, and voltage drops due to other devices.

Figure 1:
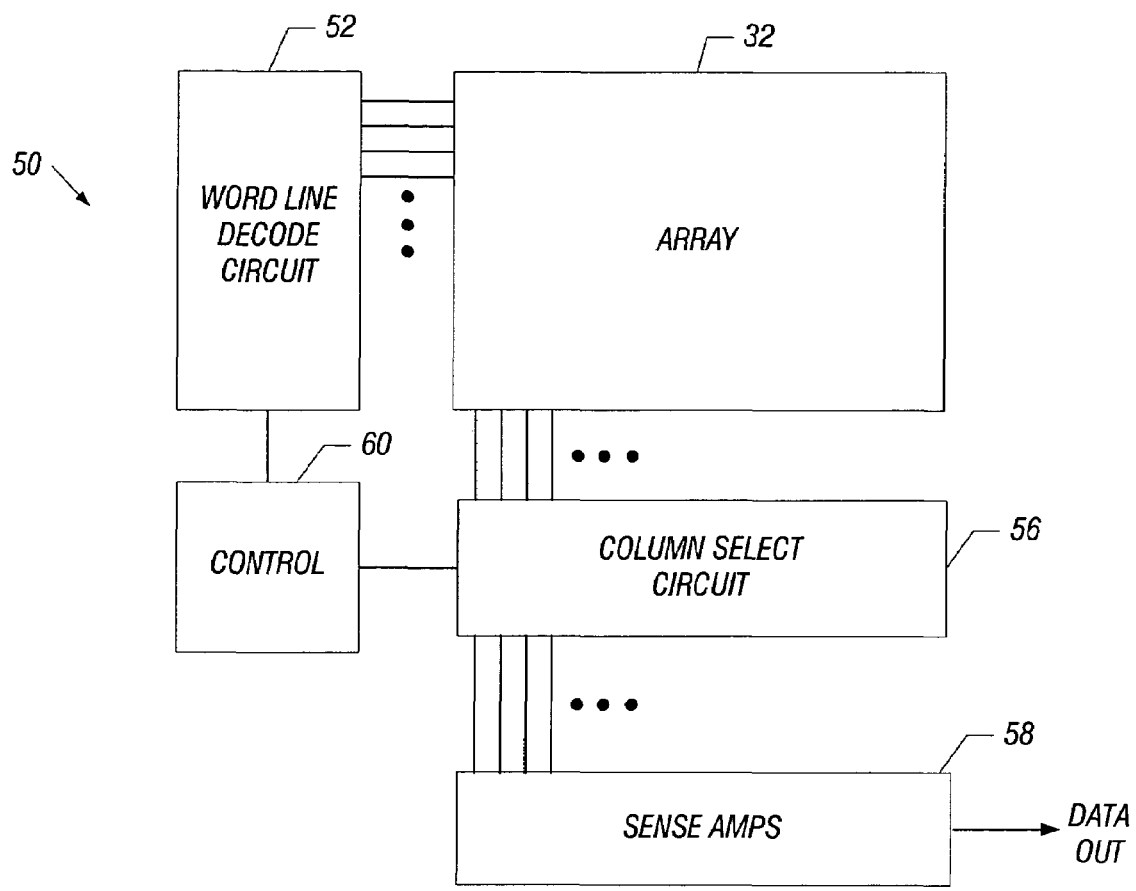
FIG. 1 is a schematic depiction of one embodiment of the present invention.

Referring to FIG. 1, a flash memory 50 may include an array 32 which uses a virtual ground arrangement. A virtual ground arrangement removes the contact from the drain of the memory cells in the array 32. The array 32 may be addressed by a word line decode circuit 52 and a column select circuit 56. The column select circuit 56 may be coupled to the sense amplifiers 58 which provide output data.

Figure 2:
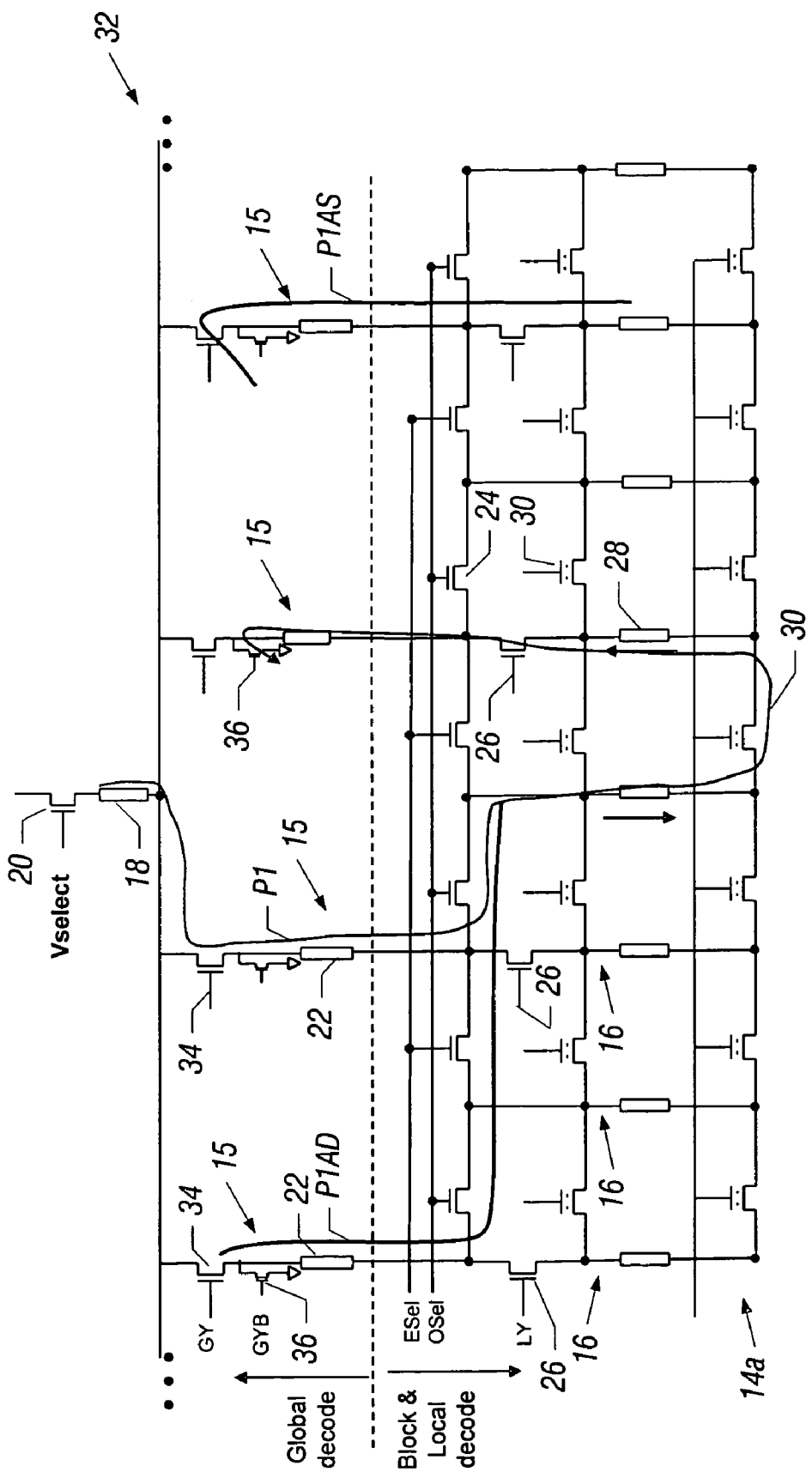
FIG. 2 is a schematic depiction of one architecture for an array in accordance with one embodiment of the present invention.

Referring to FIG. 2, the array 32 may include a polysilicon word line (WL) 14*a* which is strapped by a metal word line (not shown). High voltage is applied to the word line 14*a* to turn on a selected cell 30 in adjacent input/output group columns. Unselected word lines may be biased at ground or negative voltage to shut off all the connected cells on those word lines. Since there are generally no contacts at either drain or source, the bitlines 16 may be formed by diffusions. Then, the diffusion bitlines 16 are strapped by metal bitlines (not shown) to reduce the resistance. In some embodiments, the density of the bitline straps can be 32 rows per strap or 16 rows/strap. One I/O group of columns may contain 16 bitlines or 32 bitlines.

In the embodiment shown in FIG. 2, the drains and sources of the cells 30 are symmetrical. Thus, it is arbitrary which one is called the drain and which one is called the source and the higher voltage can be applied to either cell side in some embodiments. However, it may be advantageous to have adjacent I/O groups with sources on opposed sides of the cells.

According to the "swap" architecture for the array 32, shown in FIG. 2, an array select transistor 20 couples a line having an inherent resistance 18. The transistor 20 enables a connection to a selected global bitline 15 via the path P1. The path P1 includes a global drain select (GY) transistor 34, a global source select transistor (GYB) 36 and the selected cell 30. The path P1 then extends through the inherent global bitline resistance 22. The global bitlines 15 are indicated above the dotted line and the local bitlines 16 are indicated below the dotted line.

While, normally, a local bitline select transistor (LYS) would be included on each global bitline 15, the local bitline select transistors 26 are moved down onto every other local bitline 16 in the swap architecture. Then, only one local bitline select transistor 26 is in the path P1, reducing the voltage drop by the voltage drop of the one eliminated local bitline select transistor from each select path, such as the path P1. Thus, the selected cell 30 may be accessed along the path P1 through the local bitline resistances 28 and one local bitline transistor 26 up to the global bitline source select transistor 36.

In the architecture shown in FIG. 2, there is one global bitline 15 for every other local bitline 16. One local bitline 16 is selected by the even block select line (ESel) and the other adjacent local bitline is selected by a signal on the odd block select line (OSel). The shunt devices 24 have their gates coupled to ESel or OSel to couple two local bitlines 16.

In the swap architecture, the number of global select transistors 34, 36 may be (n/2+1)×2, where the number of I/O groups is n. For 16 cells per I/O group, the count of drivers is 18 and for 32 cells per I/O group, the driver count is 34. The number of global bitlines 15 may be (n+1) per two I/O groups.

The decoding of a shunt device control may be implemented variously. In one embodiment, there is even/odd decoding and in another embodiment there is full decoding. For even/odd decoding there may be a total of three control signals at the local block level: LYS, OSel, and ESel to control the LYS transistors and shunt devices. In the fully decoded structure, the odd and even select lines (OSel, ESel) are eliminated and each bitline is an independent bitline. For the full decoding case, only the shunt device in parallel with the selected flash cell is shut off, providing parallel global bitlines (paths P1AD, P1AS, and P1) and further reducing the global bitline voltage drop. Reducing the global bitline voltage drop may reduce the maximum voltage that unselected cells see. However, such an embodiment would operate substantially as depicted in FIG. 2.

For a full decode architecture, a source pull down transistor may be provided at the drain side to create global bitline 34 (GY)/source global bitline 35 (GYB) transistor pairs. Two pairs of GY/GYB transistors 34, 36 may be used, without addition for local Y-select (LY) drivers 26. If no source pull down transistor is used on the drain path, it is only necessary to add LY control signals and LY gate select drivers.

If the number of cells per I/O group is n, the number of LY drivers may be (2n+1)×2. In one embodiment, if the source of the LY select drivers can use the supply voltage signal, then for 16 cells per I/O group, the driver count is 66 and for 32 cells per I/O group, the driver count is 130.

In some embodiments, eliminating one transistor per local bitline select path may reduce the voltage drop by about 150 millivolts. Thus, the architecture depicted in FIG. 2 may be called the swap architecture because a shunt device is swapped between the global and the local bitlines.

Figure 3:
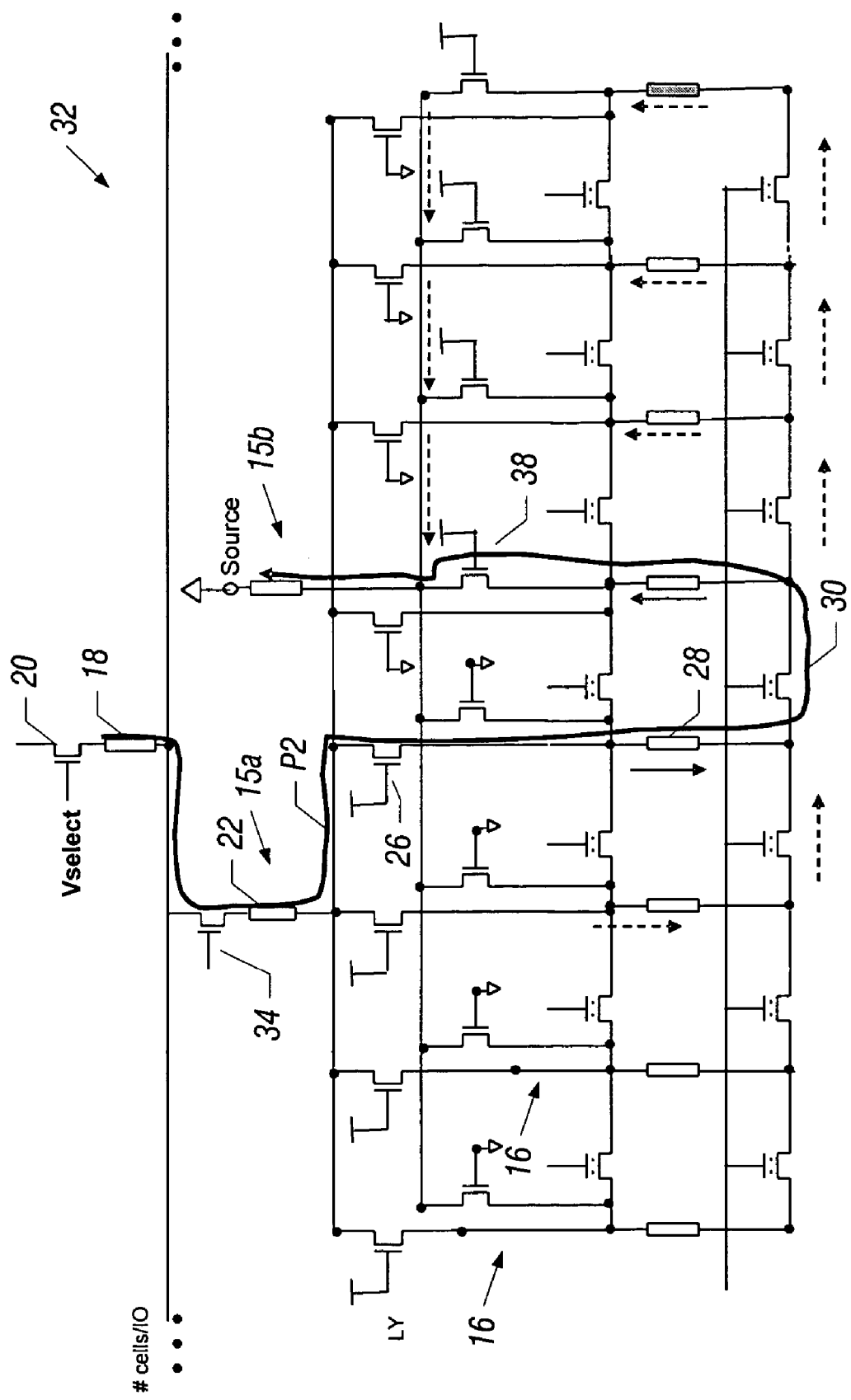
FIG. 3 is a schematic depiction of another architecture in accordance with another embodiment of the present invention.

Referring next to FIG. 3, in accordance with another architecture, which may be called a reduced global bitline architecture, the number of global bitlines 15 is reduced so that there is only a single global bitline 15a for the drain and a single global bitline 15b for the source in one embodiment. A global select transistor 34 may be provided on the global bitline 15a and an inherent resistance 22 is indicated to represent the resistance of the bitline 15a. Thus, the effect is to move more decoding to the local bitlines 16, making the decoding more complicated in the local bitlines 16.

However, the reduced number of global bitlines 15 allows the global bitlines 15 to be made wider because there is more available room and because the global bitlines 15 need not follow the pitch of the local bitlines 16. As a result, the resistance of the global bitlines 15 may be reduced, reducing the voltage drop when accessing a selected cell 30 through a local bitline 16 having an inherent resistance 28, indicated schematically.

Again, the local select transistors 26 select the appropriate local bitline 16 on the selected path P2. The transistors 38 provide the source connection for the overall path P3.

Figure 4:
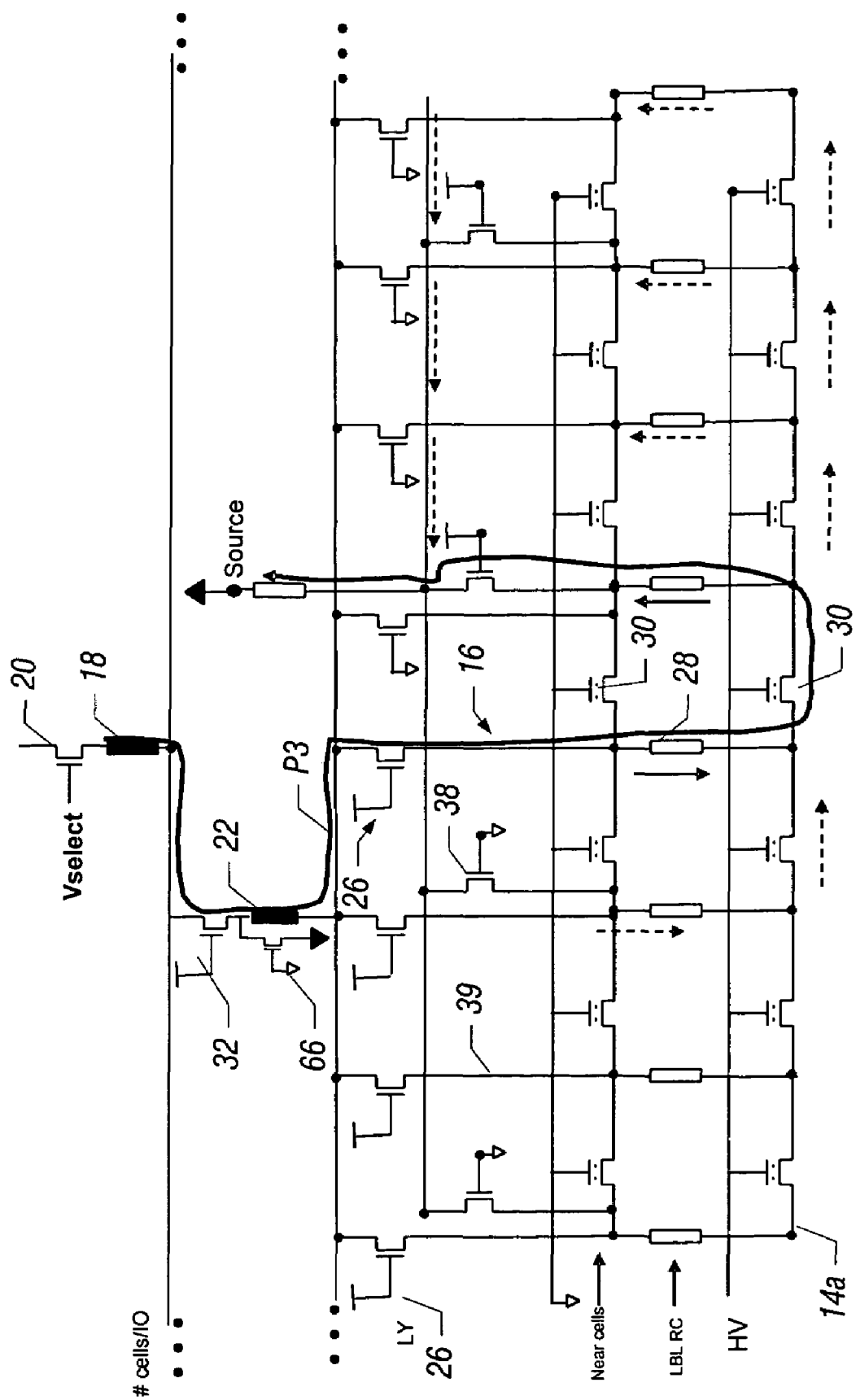
FIG. 4 is a schematic depiction of still another architecture in accordance with one embodiment of the present invention.

Finally, referring to FIG. 4, in a reduced source connection architecture, every other one of the transistors 38 in the reduced global bitline architecture, shown in FIG. 3, may be eliminated (as indicated, for example, at 39) and replaced with a single transistor 38. Thus, for example, on the select path P3 in FIG. 4, there are no adjacent transistors 38 on adjacent local bitlines 10, as is the case of the path P2 in FIG. 3. The elimination of transistors 38 reduces the number of transistors in the path P3 compared to the path P2, also reducing the voltage drop.

For a reduced source connection architecture, a source pull down transistor 66 may be used on the drain side for sensing the I/O cells and the local bitline transistor 26 results in no change. A control may be provided for the source pull down and the GY select transistor 32. Instead of having a single pair of GY/GYB control signals, two pairs of signals may be used. Otherwise, local bitline select transistors 26 may be necessary.

Before programming or sensing, some of the bitlines may need to be discharged first. In a pre-discharge step, the transistors 66 are turned on to discharge the path P3. Since some local bitlines on the source side are floating during sensing or programming, the sneak path impedance is increased and this leads to reduction of sneak current.

If the number of cells per I/O group is n, the number of local bitline select transistors 26 may be 3n+4. On the drain side, there are 2×(n+1) drivers and on the source side there are n+2 drivers. Thus, for n=16, the number of drivers is 52 and for n=32, the number of drivers is 100.

For example, the word line 14a bias may be about 2.8 volts and 70 percent of the cells may have a threshold voltage greater than 2 volts.

Figure 5:
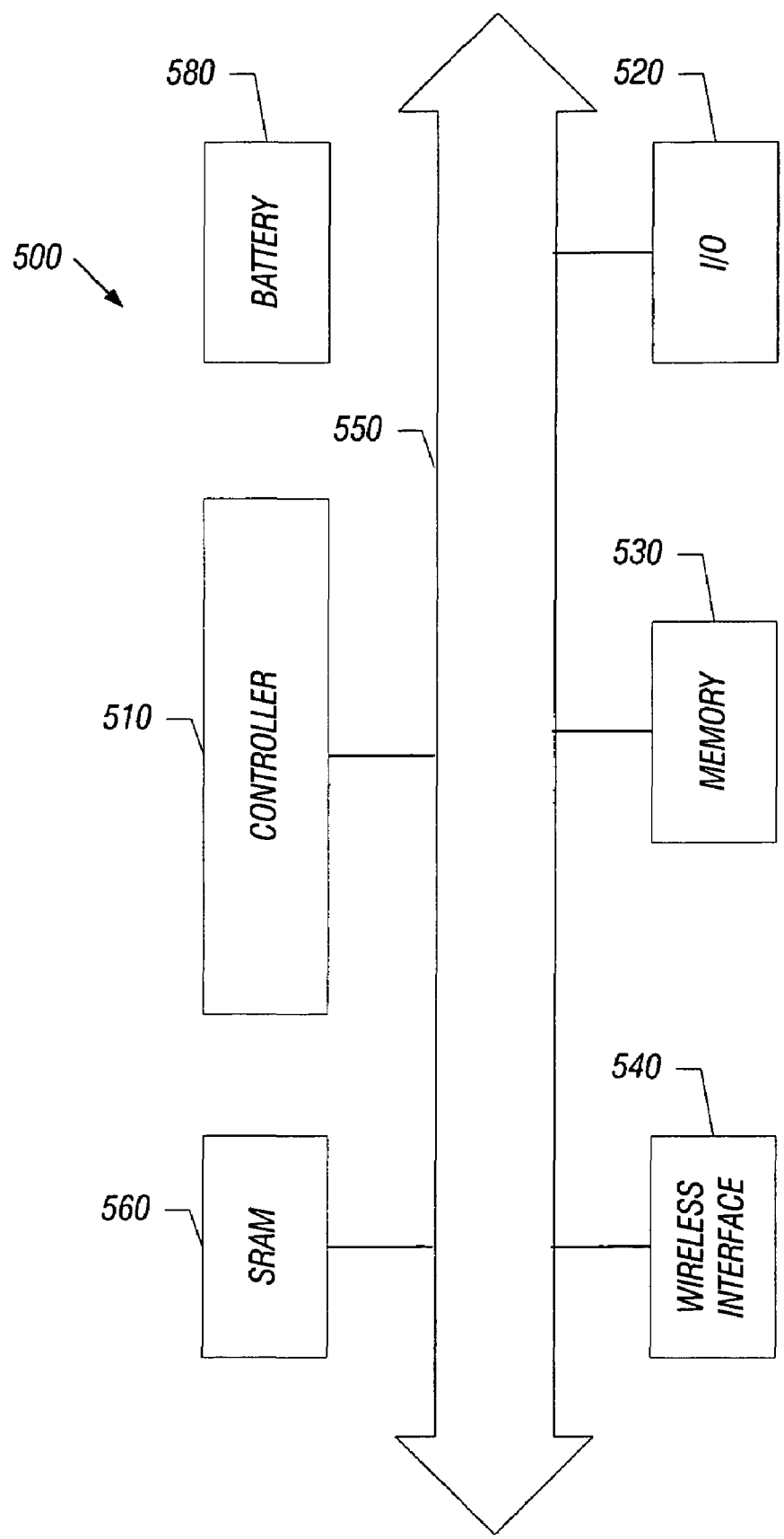
FIG. 5 is a depiction of a system using the memory of FIG. 1 in accordance with one embodiment of the present invention.

Referring to FIG. 5, in accordance with some embodiments of the present invention, a processor-based system 500 may be a personal computer, a laptop computer, a personal digital assistant, a cellular telephone, a digital camera, an entertainment system, a media player, or any of a variety of other processor-based systems. It may include a memory 530, which may be implemented by the memory 50, in some embodiments. It may also include a controller 510, which may be, for example, a microprocessor, multiple microprocessors, a digital signal processor, or a microcontroller, to mention a few examples. Coupling the controller 510 and the memory 530 may be a bus 550. The bus 550 may also be coupled to other memories, such as a static random access memory (SRAM) 560, an input/output device 520, and a wireless interface 540. The wireless interface 540 may be any system which enables wireless communications, including cellular wireless communications and networked wireless communications, to mention a few examples. The I/O device 520 may be any conventional I/O device including, among others, a display, a mouse, a keyboard, or the like.

Thus, in some embodiments, wireless communications may be implemented by the system 500 in which messages stored in the memory 530 may be communicated over the wireless interface 540. As one example, the wireless interface 540 may be a dipole antenna. Battery power 580 may be supplied in some embodiments, although the present invention is not limited to wireless applications or to battery powered applications.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   using a global bitline selecting transistor for each set of two local bitlines in a virtual ground memory array; and
   using a local bitline selecting transistor on only one of said pair of local bitlines.

2. The method of claim 1 including using full decoding for the gate control of the select transistors.

3. The method of claim 1 including accessing a selected cell using parallel paths.

4. The method of claim 3 including using parallel paths on the drain side of a selected cell.

5. The method of claim 3 including using parallel paths on the source side of a selected cell.

6. The method of claim 3 including using parallel global decoding paths to select a cell.

7. A virtual ground memory comprising:
   a virtual ground memory array;
   a global selecting circuit coupled to said array; and
   a local selecting circuit coupled to said global selecting circuit, said local selecting circuit including only one local bitline transistor to access a memory cell in said memory array.

8. The memory of claim 7 wherein said memory uses full decoding.

9. The memory of claim 7 including parallel paths to access a selected cell.

10. The memory of claim 9 including parallel access paths on the drain side of a selected cell.

11. The memory of claim 9 including parallel access paths on the source side of a selected cell.

12. The memory of claim 9 including parallel global decoding paths to select a cell.

13. A processor-based system comprising:
    a processor;
    a virtual ground memory coupled to said processor, said virtual ground memory including a virtual ground memory array, a global decoding circuit coupled to said array, and a local decoding circuit coupled to said global decoding circuit, said local decoding circuit including only one local bitline transistor to access a memory cell in said memory array; and
    a wireless interface coupled to said processor.

14. The system of claim 13 wherein said memory uses full decoding.

15. The system of claim 13 wherein said memory includes parallel paths to access a selected cell.

16. The system of claim 15 wherein said memory includes parallel access paths on the drain side of a selected cell.

17. The system of claim 15 wherein said memory includes parallel access paths on the source side of a selected cell.

18. The system of claim 15 wherein said memory includes parallel global decoding paths to select a cell.

19. The system of claim 13 wherein said wireless interface includes a dipole antenna.

* * * * *